United States Patent
Xiang et al.

(10) Patent No.: US 9,026,393 B2
(45) Date of Patent: May 5, 2015

(54) HIGH VOLTAGE INTERLOCK STRATEGY

(75) Inventors: Joe Youqing Xiang, Conton, MI (US); Venkateswa Anand Sankaran, Farmington Hills, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1397 days.

(21) Appl. No.: 12/499,014

(22) Filed: Jul. 7, 2009

(65) Prior Publication Data

US 2011/0010126 A1    Jan. 13, 2011

(51) Int. Cl.
  G01R 27/28   (2006.01)
  G01R 31/04   (2006.01)
  B60L 3/00    (2006.01)
  B60L 11/18   (2006.01)
  B60L 15/02   (2006.01)

(52) U.S. Cl.
  CPC .............. G01R 31/04 (2013.01); B60L 3/0023 (2013.01); B60L 11/1807 (2013.01); B60L 15/025 (2013.01); *Y02T 10/7005* (2013.01); *Y02T 10/643* (2013.01); *Y02T 10/70* (2013.01)

(58) Field of Classification Search
  CPC ........................................................ G01R 31/04
  USPC ........................................................ 702/117
  See application file for complete search history.

(56) References Cited

U.S. PATENT DOCUMENTS

| | | | |
|---|---|---|---|
| 7,268,521 B1 * | 9/2007 | Prakash et al. | 320/166 |
| 7,392,122 B2 | 6/2008 | Pillar et al. | |
| 7,410,020 B2 | 8/2008 | Kikuchi et al. | |
| 7,422,293 B2 | 9/2008 | Chorian et al. | |
| 2003/0214266 A1 * | 11/2003 | Cheng et al. | 318/716 |
| 2005/0110514 A1 * | 5/2005 | Trifilo | 324/772 |
| 2006/0186914 A1 * | 8/2006 | Ho | 324/772 |
| 2007/0222413 A1 * | 9/2007 | Kinoshita et al. | 320/104 |
| 2008/0042605 A1 * | 2/2008 | Subrata et al. | 318/449 |
| 2010/0213884 A1 * | 8/2010 | Xiang | 318/400.36 |

FOREIGN PATENT DOCUMENTS

JP        2004328854 A    11/2004

OTHER PUBLICATIONS

Ford, Escape Hybrid Mariner Hybrid; Emergency Response Guide, FCS-14265-08, p. 5.

* cited by examiner

*Primary Examiner* — Janet Suglo
*Assistant Examiner* — Stephanie Bloss
(74) *Attorney, Agent, or Firm* — Maristyn Law LLC; Lynda F. Kouroupis; David B. Kelley

(57) ABSTRACT

A High Voltage Interlock Strategy (HVIS) uses feedback current to detect cable connectivity status for a high-voltage cable configured to connect a power conversion circuit with a remote permanent magnet synchronous machine (PMSM). One or more feedback factors are calculated based on detected feedback current. Various algorithms for calculating a feedback factor, and for determining connectivity status based on calculated feedback factors, can be practiced, according to the PMSM operational mode. Fault detection action can be performed in response to detecting a cable disconnect. The HVIS can be implemented by software, making it a safe, economical solution for cable connectivity detection.

24 Claims, 15 Drawing Sheets

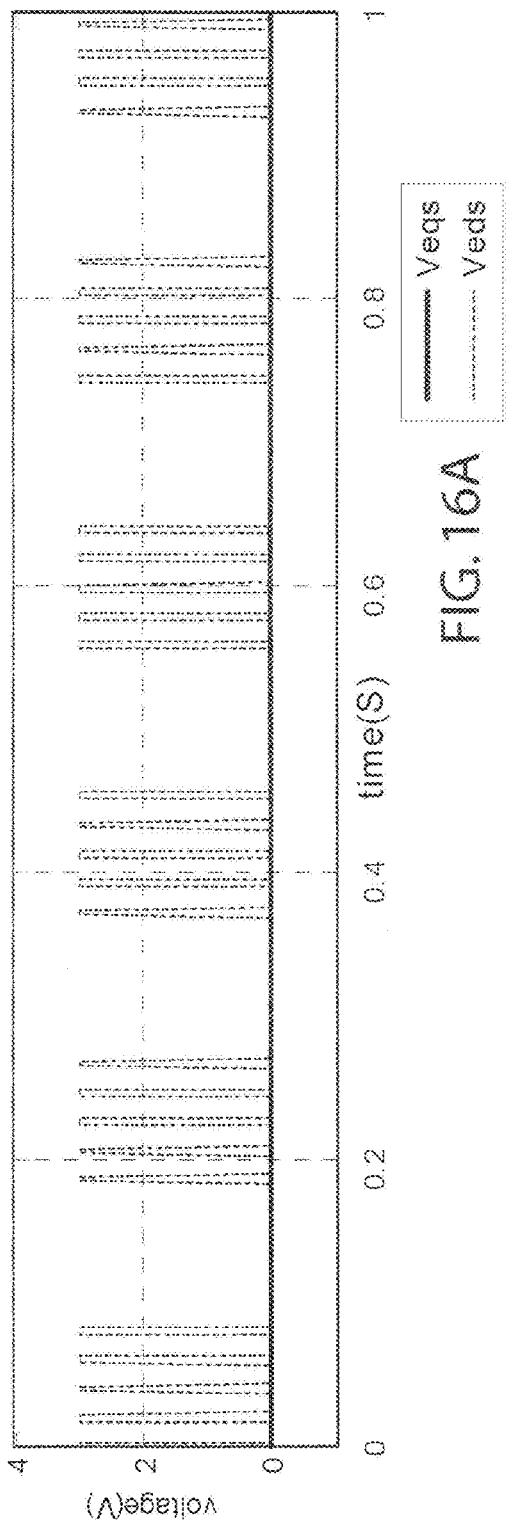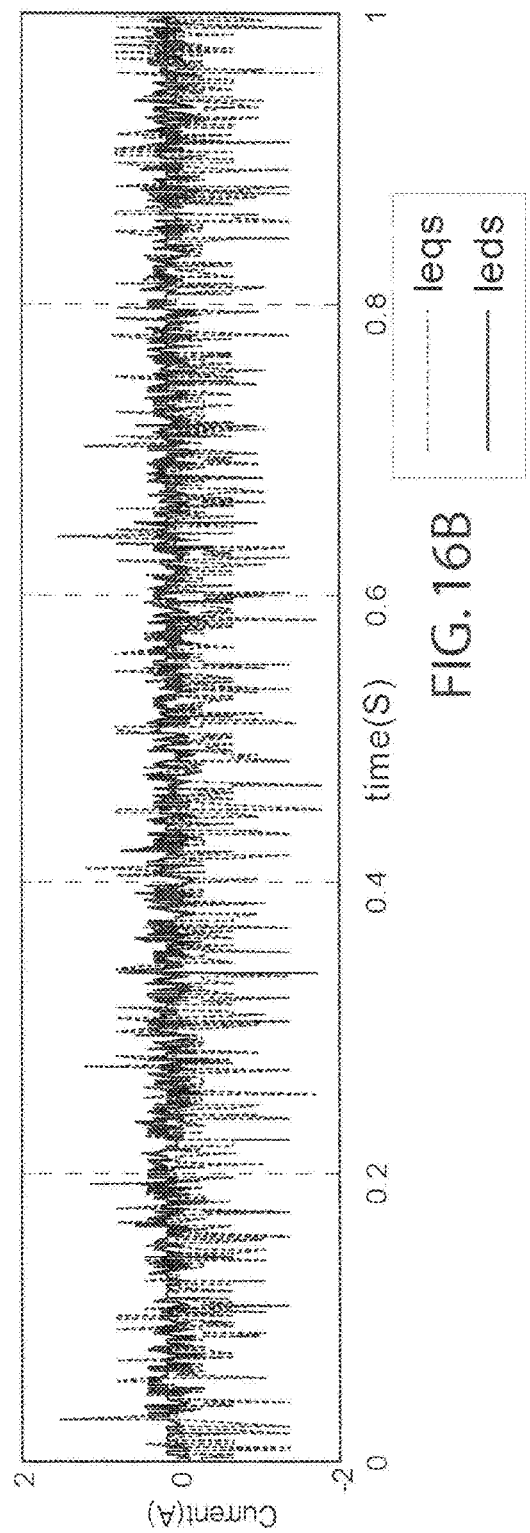
FIG. 16A
FIG. 16B

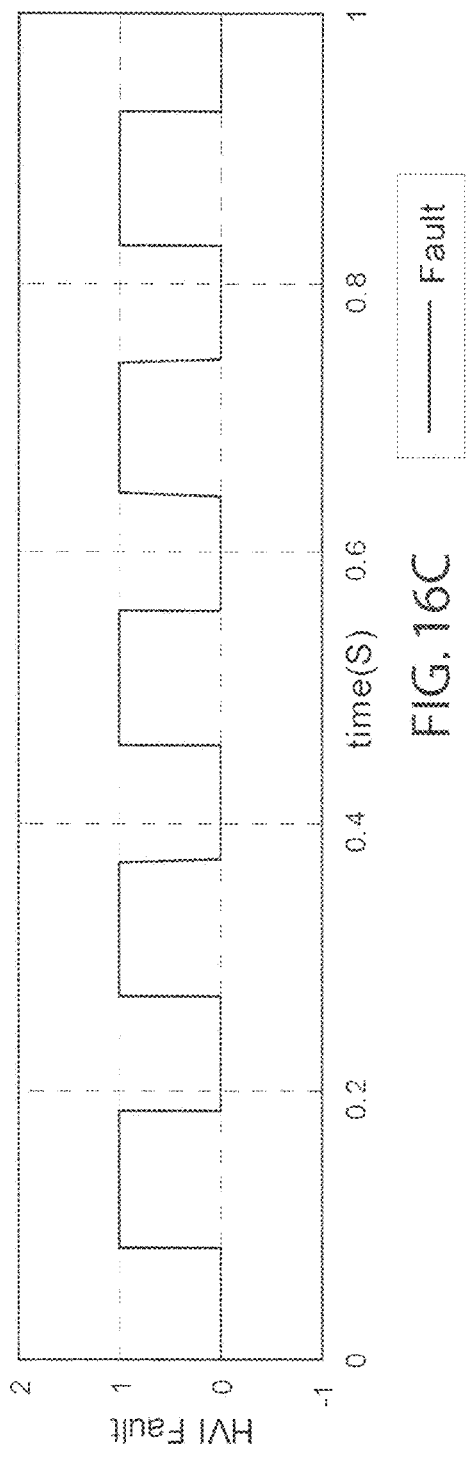

HIGH VOLTAGE INTERLOCK STRATEGY

BACKGROUND OF INVENTION

1. Field of Invention

The present invention relates to electric drive systems. In particular, the invention relates to an electric drive system having a power conversion circuit coupled to a remote permanent magnet synchronous machine (PMSM) via a high voltage interface cable.

2. Background Art

Electric machines, such as an electric or a hybrid electric vehicle, may employ electrical energy for propulsion via an electric drive system. An electric drive system can encompass a number of components, typically including at least a power circuit such as a power electronics converter (PEC), and a motor. In this arrangement, the power circuit can controllably transfer power from the power source to the motor to drive a load. In the past, the power conversion circuit or the PEC was typically integrated with and packaged with the motor. However, PEC and motor integration is associated with several disadvantages, including higher costs, a more limited selection of suppliers, and reduced PEC reliability.

Separation of the PEC from the motor allows for greater design flexibility and reduced costs. However, if the high voltage inteerface cable that connects a PEC with a remote PMSM becomes disconnected during vehicle operation or during maintenance procedures, it is critical that the high voltage energy within the PEC be discharged. Otherwise, the electronic drive system may continue to generate a high voltage current on the exposed portion, posing a hazard to persons that may come in contact with, or be proximate to the exposed portion. Attempts to address the hazards imposed by a disconnected cable include cable connector designs that decrease the likelihood that the cable will become disconnected. However, such designs have been quite costly and have not been shown to be fail-proof.

SUMMARY OF THE INVENTION

An exemplary embodiment of the invention provides a system for detecting the connection status of an interface cable configured to couple a permanent magnet synchronous machine (PMSM) with a remote power conversion circuit, such as a Power Electronics Converter (PEC). An exemplary system includes a power circuit configured to provide current to the PMSM, an interface cable configured to couple said power circuit and said PMSM, a current sensor configured to detect current flow through said interface cable, a controller coupled to said power circuit and configured to control power circuit operation, and a high voltage interlock strategy (HVIS) module configured to use information from said current sensor to determine said interface cable connection status.

An exemplary method includes detecting that a pre-charging contact is closed; in response to detecting said pre-charging contact is closed, performing a pre-charging mode detection algorithm; in response to determining that cable connectivity is good as a result of performing said pre-charging mode detection algorithm, performing a zero-current mode detection algorithm when a command current for a PMSM is zero, or performing a current-generation mode detection algorithm when said command current for said PMSM is not zero. An example method of the invention can also include performing a fault-detection action in response to determining that the cable is disconnected.

In at least one embodiment, a method of the invention includes: calculating at least one feedback factor based on detected feedback current; using said at least one calculated feedback factor to determine cable connectivity for a cable configured to connect a permanent magnet synchronous machine (PMSM) with a power conversion circuit configured to provide current to said PMSM via said cable; and performing an action in response to a cable connectivity determination.

An example method for detecting voltage cable connectivity includes: calculating a difference between a command current for a permanent magnet synchronous machine (PMSM) and a feedback current for said PMSM; calculating an average of a square of said difference between said command current and said feedback current over a predetermined period; calculating a squared difference magnitude using said calculated average; calculating a squared command current magnitude using a square of said command current; and comparing said squared difference magnitude and said squared command current magnitude to determine connectivity status of a three-phase cable configured to connect said PMSM to a power circuit configured to provide current to said PMSM. In a preferred embodiment, this method is performed during closed-loop regulation of a PMSM current-generation operational mode.

An example method for determining voltage cable connectivity status includes: calculating a feedback current vector magnitude for a current vector representing feedback current; calculating back electromotive force for a permanent magnet synchronous motor (PMSM); calculating an estimated current vector magnitude using said calculated electromotive force; comparing said feedback current vector magnitude with said estimated current vector magnitude to determine connectivity status of a three-phase cable configured to connect said PMSM with a power circuit configured to provide current to said PMSM.

BRIEF DESCRIPTION OF THE DRAWINGS

FIG. 16A shows data for a test conducted during a zero-current mode with a cable disconnected.

FIG. 16B shows data for a test conducted during a zero-current mode with a cable disconnected.

FIG. 16C shows data for a test conducted during a zero-current mode with a cable disconnected.

FIG. 16D shows data for a test conducted during a zero-current mode with a cable disconnected.

DETAILED DESCRIPTION OF EXAMPLE EMBODIMENTS

Example embodiments of the invention are presented herein; however, the invention may be embodied in a variety of alternative forms, as will be apparent to those skilled in the art. To facilitate understanding of the invention, and provide a basis for the claims, various figures are included in the description. The figures are not drawn to scale and related elements may be omitted so as to emphasize the novel features of the invention. Structural and functional details depicted in the figures are provided for the purpose of teaching the practice of the invention to those skilled in the art and are not to be interpreted as limitations. For example, control modules for various systems can be variously arranged and/or combined, and are not to be considered limited to the example configurations presented herein.

Figure 1:
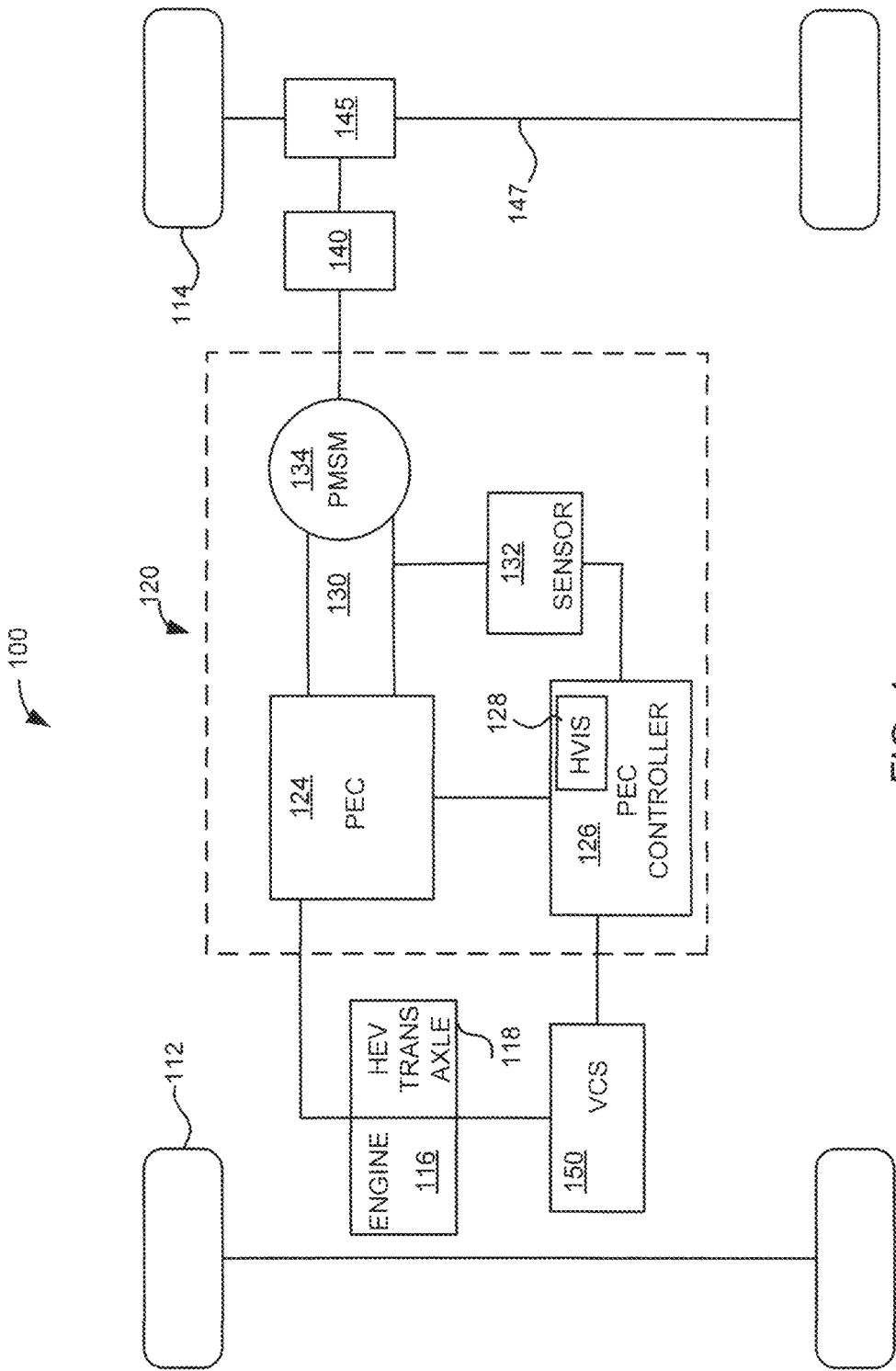
FIG. 1 illustrates an example vehicle system having a power electronics converter (PEC) coupled to a remote permanent magnet synchronous machine (PMSM) via an interface cable.

FIG. 1 illustrates a schematic of an example vehicle 100. The vehicle 100 may be of any suitable type, such as an electric or hybrid electric vehicle. In at least one embodiment, the vehicle 100 may include a first wheel set 112, a second wheel set 114, an engine 116, HEV transaxle 118 and an electric drive system 120. The electric drive system 120 may be configured to provide torque to the first and/or second wheel sets 112, 114. The electric drive system 120 may have any suitable configuration. For example, the electric drive system 120 may include a power conversion circuit in the form of a Power Electronics Converter (PEC) 124 coupled to a Permanent Magnet Synchronous Machine (PMSM) 134. The PMSM 134 can be coupled to a power transfer unit 140, which in turn can be coupled to a differential 145 to control the wheel set 114. It is contemplated that the PMSM 134 can function as a motor, converting electrical energy to kinetic energy, or as a generator, converting kinetic energy to electrical energy. In an example embodiment, the PEC 124 can be connected to a first PMSM functioning as a motor via a first interface cable, and a second PMSM functioning as a generator via a second interface cable. Moreover, in a hybrid electric vehicle the electric drive system 120 may be a parallel drive, series drive, or split hybrid drive as is known by those skilled in the art.

The PEC 124 can be coupled to a PEC controller 126. The PEC 124 can include hardware circuitry configured to provide power to the PMSM 134. The PEC controller 126 can be a microprocessor-based device configured to control operation of the PEC 124, and comprise hardware, software, firmware or some combination thereof. The PEC controller 124 may be electrically coupled to a Vehicle Control System (VCS) 150 from which it may receive signals from other control units regarding vehicle system operation and control.

The PEC 124 can be electrically connected to the PMSM 134 by a high-voltage three-phase interface cable 130, by which the PEC 124 provides power to the PMSM 134. A current sensor 132 can detect current within the cable 130 and provide a current sensor signal having information pertaining to one or more currents flowing within the cable 130. In an exemplary embodiment, the cable 130 is a three-phase cable configured to conduct three currents of different phases. For example, the cable 130 can comprise a set of three cables, each configured to carry a current of a particular phase. In at least one example embodiment, current sensor 132 comprises a first current sensor configured to detect a first phase current, a second current sensor configured to detect a second phase current, and a third current sensor configured to detect a third phase current. Each of said first, second and third current sensors can provide a signal to the PEC controller 124. The phase currents detected by the current sensor 132 are referred to herein as feedback currents or feedback phase currents.

The PEC controller 126 can include a High Voltage Interlock Strategy (HVIS) module 128 configured to use information from the current sensor 132 to determine the connectivity status of the cable 130. In at least one example embodiment, the HVIS module 128 uses current sensor information to calculate a feedback factor that is used to determine cable connectivity. A determination that the cable 130 is disconnected indicates that the cable 130 is either disconnected from the PEC 124, or it is disconnected from the PMSM 134. In an example embodiment in which the cable 130 comprises a cable set of three single-phase cables, good connectivity requires all 3 cables to be connected. In a preferred embodiment, the HVIS module 128 comprises software that can be executed by the PEC controller 126, thereby reducing or eliminating the need for additional hardware or equipment.

The PMSM 134 may be configured to be powered by one or more power sources to drive the vehicle traction wheels. The PMSM 134 may be of any suitable type, such as a motor, motor-generator, or starter-alternator. In addition, the PMSM 134 may be associated with a regenerative braking system for recovering energy.

The power transfer unit 140 may be selectively coupled to at least one PMSM 134. The power transfer unit 140 may be of any suitable type, such as a multi-gear "step ratio" transmission, continuously variable transmission, or an electronic converterless transmission as is known by those skilled in the art. The power transfer unit 140 may be adapted to drive one or more vehicle wheels. In the embodiment shown in FIG. 1, the power transfer unit 140 is connected to a differential 145 in any suitable manner, such as with a driveshaft or other mechanical device. The differential 145 may be connected to each wheel of the second wheel set 114 by a shaft 53147, such as an axle or halfshaft.

Figure 2:
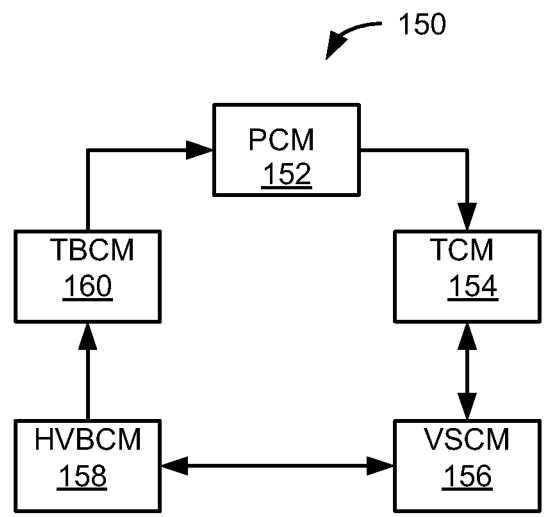
FIG. 2 depicts an example Vehicle Control System that can be coupled to a PEC controller.

The vehicle 100 may also include a vehicle control system (VCS) 150 for monitoring and/or controlling various aspects of the vehicle 100. The VCS 150 may communicate with the PEC controller 126, and the power transfer unit 140 and their various components to monitor and control operation and performance. The VCS 150 may have any suitable configuration and may include one or more controllers or control modules. In one exemplary embodiment shown in FIG. 2, the VCS 150 includes a powertrain control module (PCM) 152, a transaxle control module (TCM) 154, a vehicle stability control module (VSCM) 156, a high voltage battery control module (HVBCM) 158, and a traction batter control module (TBCM) 160. The control modules 152-160 may be configured to communicate with each other as indicated by the arrowed lines, however it is contemplated that communication between and among the control modules can be variously arranged. In addition, one or more control modules 152-160 may be configured to communicate with and/or control various aspects of the vehicle 100. For instance, the TBCM 160 may monitor environmental attributes (e.g., temperature) and control the operation of one or more power sources. The transaxle control module TCM 154 may communicate with the PEC controller 126 to control the PMSM 134 and the amount of torque provided to the vehicle traction wheels. It is noted that the TCM 154 may alternatively be embedded within the PEC 124 or the PEC controller 126.

Figure 3:
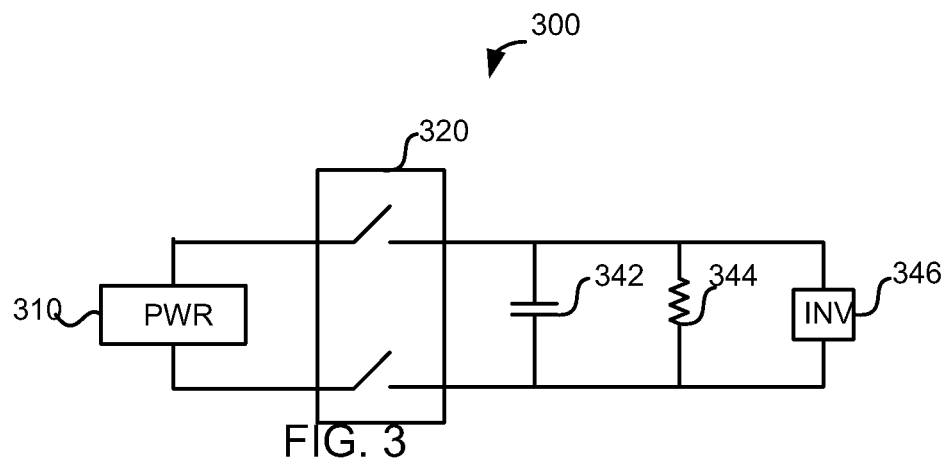
FIG. 3 illustrates an example PEC of the system shown in FIG. 1.

FIG. 3 shows an example power conversion circuit of a system of the invention. PEC 300 is an example embodiment of PEC 124 of FIG. 1. The PEC 300 can include a first power source 310 coupled to contactors 320. In various embodiments, such as hybrid electric vehicle embodiments, additional power systems may be provided. For instance, a second power system may be provided that has an electrical power source or non-electrical power source like an internal combustion engine. The first power source 310 may be of any suitable type. For instance, the first power source 310 may be an electrical power source such as a battery having a plurality of electrically interconnected cells, a capacitor, or a fuel cell. If a battery is used it may be of any suitable type, such as nickel-metal hydride (Ni-MH), nickel-iron (Ni—Fe), nickel-cadmium (Ni—Cd), lead acid, zinc bromine (Zn—Br), or lithium based. If a capacitor is used it may be of any suitable type, such as an ultra capacitor, super capacitor, electrochemical capacitor, or electronic double layer capacitor as is known by those skilled in the art.

The one or more contactors 320 may be adapted to selectively connect and disconnect the first power source 310 from the rest of the electrical drive system 120. The contactors 320 may be of any suitable type and may be disposed in any suitable location, such as inside or outside a housing that contains the first power source 310. The PEC 300 includes a device for storing an electrical charge, such as a capacitor 342, coupled to an inverter 346 via a resistance 344. In an example embodiment, the capacitor 342 is a high-voltage capacitor. In a further example embodiment, the capacitor 342 can comprise two parallel capacitors. The inverter 346 may be electrically coupled to, and configured to provide power to, at least one electrical machine, such as PMSM 134. Should the cable 130 become disconnected, it is prudent to discharge the capacitor 342 to prevent injury to operators or maintenance personnel. The discharge process can be conducted through a PMSM that is connected to the PEC 124, or through an internal resistance in the PEC 124. For example, as shown in FIG. 3, resistance 344 can be used in the discharge process. In an example embodiment, the inverter 346 is configured to provide three separate phase currents to the PMSM 134, which, in an example embodiment, is operating as a three-phase synchronous machine. The PEC 300 may include additional circuitry that is not shown in FIG. 3.

Figure 4:
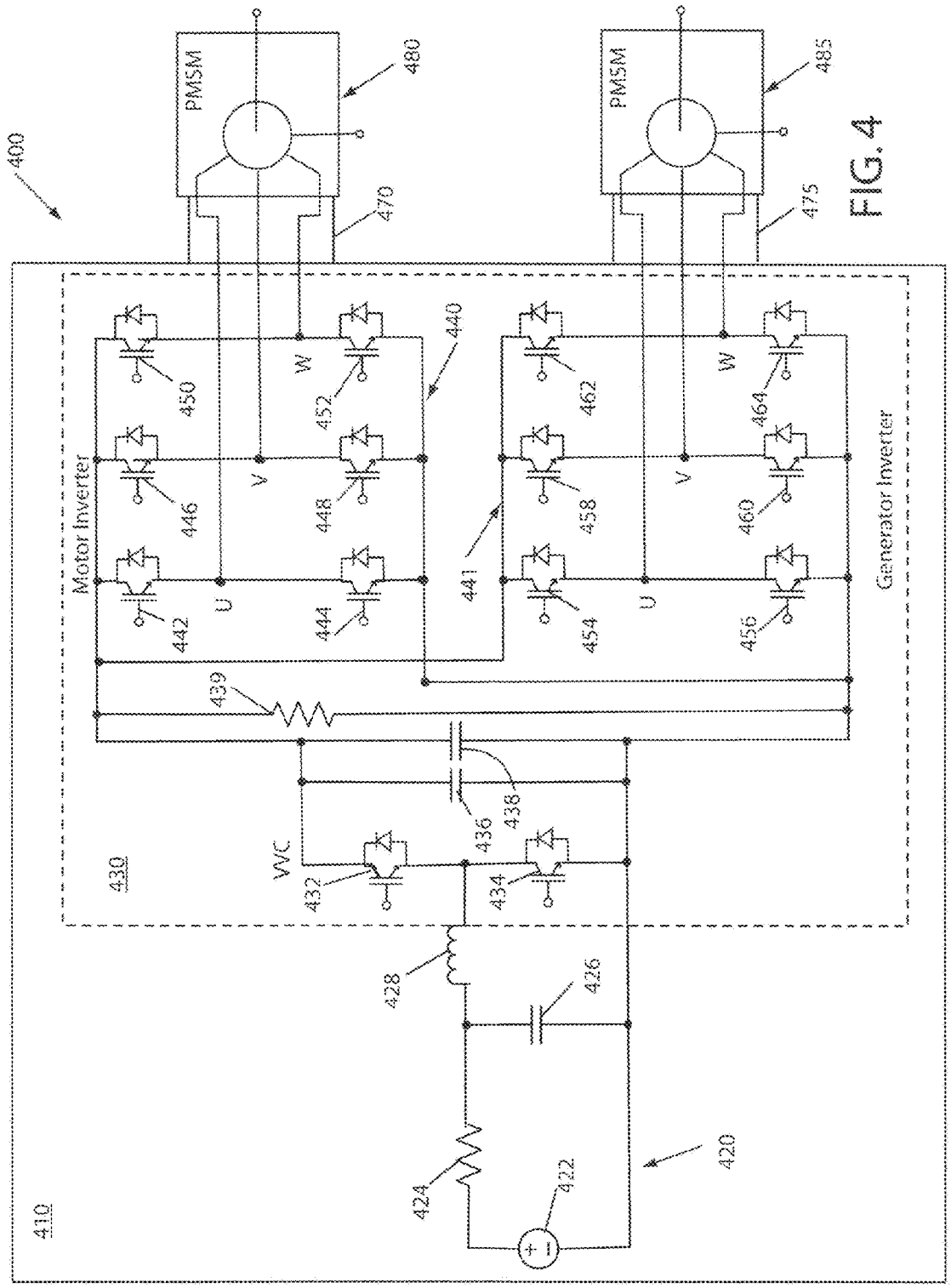
FIG. 4 depicts an example system that can be coupled to a PEC controller having an HVIS module.

FIG. 4 depicts an example embodiment of an EDS 400 having a PEC 410 coupled to a first PMSM 480 and to a second PMSM 485. The PEC 410 comprises a power circuit 420 coupled to an inverter circuit 430. The power circuit 420 can comprise a power source 422 in series with a resistance 424. The power circuit 420 can also include a capacitance 426 in parallel with the power source 422. An inductance 428 can couple the resistance 424 with contacts 432 and 434. Coupled to the contacts 432 and 434 can be a first capacitance 436 and a second capacitance 438, which together form a high voltage capacitance for the PEC 410. In an example embodiment, a resistance 439 can be included in the PEC 410 in parallel with the high voltage capacitance to provide a possible means of discharge for the high voltage capacitance should a cable, such as cable 470 or 475, connecting the PEC 410 with a PMSM become disconnected.

The inverter circuit 430 comprises a first inverter portion 440 for the first PMSM 480 and a second inverter portion 441 for the second PMSM 485. The inverter circuit 430 can comprise insulated gate bipolar transistors (IGBT) 442, 444, 446, 448, 450, 452, 454, 456, 458, 460, 462 and 464. IGBT transistors combine the simple gate drive characteristics of metal-oxide-semiconductor field-effect-transistors (MOSFETs) with the high current and low saturation voltage capabilities of bipolar transistors. Thus, IGBT inverters have low on-state voltage drops and high blocking voltage capabilities. The fast switching speeds of an IGBT inverter make it well-suited to electric drive system applications, particularly those utilized in electric vehicles. In the example embodiment 400, the first PMSM 480 operates as a motor, and the second PMSM 485 operates as a generator.

Figure 5:
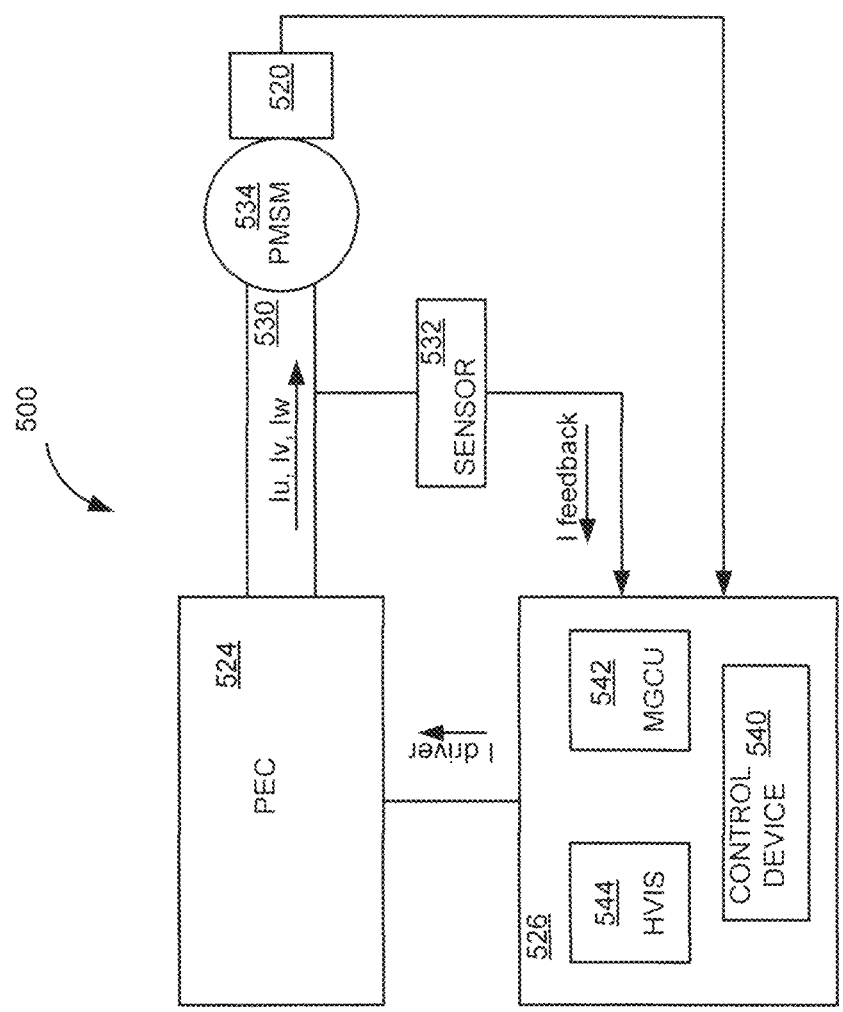
FIG. 5 depicts an example system in which a PEC controller includes a high voltage interlock strategy (HVIS) module and a motor generator control unit (MGCU).

FIG. 5 depicts an example system 500 having a PEC 524 connected to a voltage cable 530 that provides electrical connectivity between the PEC 524 and a PMSM 534. In a preferred embodiment, the PMSM 534 is a synchronous ac three-phase machine operating as a motor. Accordingly, in the example system 500, three phase currents, Iu, Iv, Iw are provided to the PMSM 534 by the PEC 524 via the cable 530. Cable 530 is a three-phase cable that can comprise three single-phase cables.

The PEC 524 is also coupled to a PEC controller 526 which can control operation of the PEC 524. The PEC controller 526 can include hardware, software, firmware, or some combination thereof. The PEC controller 526 can include a microprocessor-based control device 540 for performing control functions and processing information. The control device 540 can be configured to execute software algorithms as well as store information. The PEC controller 526 can include a motor/generator control unit (MGCU) 542. In an example embodiment, the MGCU 542 can be in the form of a printed circuit board having the circuitry necessary to receive feedback current, receive or establish reference currents and voltages, regulate current, and command voltages and currents, as well as perform other operations associated with the command and control of the PMSM 534. Although depicted as a separate block in the block diagram of FIG. 5, it is noted that the PEC controller 526, or any portion thereof, can be integrated with or embedded in the PEC 524. For example, the MGCU 542 can be embedded within the PEC 524 and be in communication with the PEC controller 526. The PEC controller 526 can receive input from a sensor 532 that detects current within the cable 530. For example, feedback current detected by sensor 532 can be received at the MGCU 542. Sensor 532 can comprise separate sensors to detect one or more of the separate currents Iu, Iv, and Iw. The PEC controller 526, for example via the MGCU 542, can also receive input from a position sensor 520 configured to detect PMSM 534 positioning.

The PEC controller 526 includes an HVIS module 544. The HVIS module 544 can be in communication with the MGCU 542 to receive information regarding currents and voltages associated with the PMSM 134, as well as other information related to the PMSM 534 operations. The HVIS module 544 can use information from the MGCU 542 as well as the control device 540 to determine the connectivity status of the cable 530. The HVIS 544 can comprise software and include one or more algorithms to determine cable 530 connectivity status based on feedback phase currents detected by sensor 532. For example, the HVIS 544 can use sensor input to calculate a feedback factor based on one or more detected feedback currents. In an example embodiment, the HVIS 544 comprises software maintained on a computer readable medium and comprises computer-executable instructions that can be executed by the control device 540. Although shown for illustrative purposes as a separate block, it is understood that in an exemplary embodiment the HVIS 544 comprises software, the logic of which can be programmed into the control device 540. In addition to determining connectivity status, the HVIS 544 can perform or initiate action in response to a connectivity determination. When cable connectivity is good, the HVIS 544 can send a confirmation signal confirming connectivity. When a disconnect is detected, the HVIS 544 can perform fault-detection action such as notifying a higher level control unit, discharging the high voltage capacitance, or other action. The discharging process can be conducted through a resistance in the power conversion circuit, or through a PMSM that remains connected. Referring to FIG. 4, if it is determined that the cable 470 is disconnected, a discharge process can be performed through PMSM 485.

Figure 6:
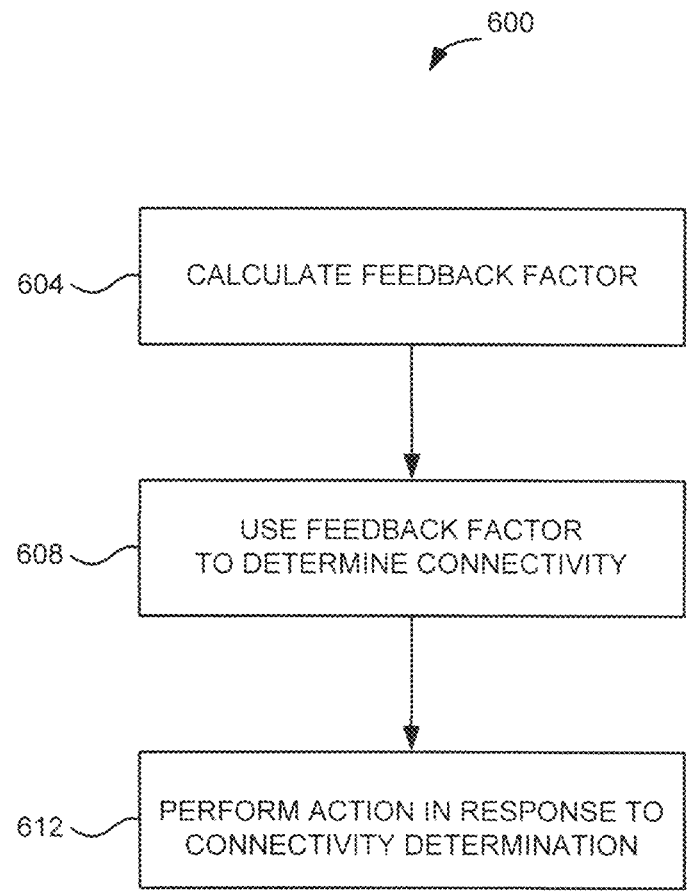
FIG. 6 depicts an example method of determining a cable connection status.

FIG. 6 illustrates an example method 600 for determining the connectivity status of an interface cable configured to connect a PMSM with a power conversion circuit, such as cable 530, which is configured to connect PEC 524 with PMSM 534. At block 604, the method 600 includes calculating a feedback factor using PMSM feedback current. Referring to FIG. 5, the sensor 532 can detect or sample one or more of the three currents Iu, Iv, Iw provided to the PMSM 534, referred to herein as feedback currents. Sensor 532 output can be received by the MGCU 542 and feedback current information communicated to the HVIS 544, which then calculates a feedback factor value. The feedback factor value need not be the magnitude or measure of any particular feedback current Iu, Iv, Iw, but instead can be a calculated value that is a function of several components, at least one of which can be related to one of the feedback currents Iu, Iv, or Iw. In an exemplary embodiment, current characteristics sampled by sensor 532 are converted to a digital format by an analog-to-digital (A/D) converter, for example an A/D converter at sensor 532 or at PEC controller 526.

At block 608, the HVIS module 544 uses the calculated feedback factor to determine the connectivity status of a cable configured to connect a PEC with a PMSM. For example, sampled feedback current can be represented by a current vector, and a feedback factor can comprise a calculated magnitude of the current vector. In an example embodiment, the calculated feedback factor can be compared to a predetermined reference or threshold value, or a predetermined range of values, to determine connectivity status. At block 612, the HVIS module 544 can perform an action in response to a cable connectivity determination. For example, if a cable is determined to be disconnected, a fault-detection action can be performed. For example, the HVIS 544 could prompt transmission of a signal to a high level control system, such as the VCS 150, to initiate an action. As an example, the HVIS 544 could send, or prompt the PEC control device 540 to send a signal to the PCM 152 or the VSCM 156 to update the driver information display or opening the contacts 320. As another example, the HVIS 544 could initiate the discharge of the high voltage capacitor 342 of the PEC 300. Upon confirming the completion of the discharge process, a confirmation signal can be sent to a high level controller, such as VCS 150. If the cable connectivity status is determined to be good, or connected, a signal confirming connectivity can be sent.

Figure 7:
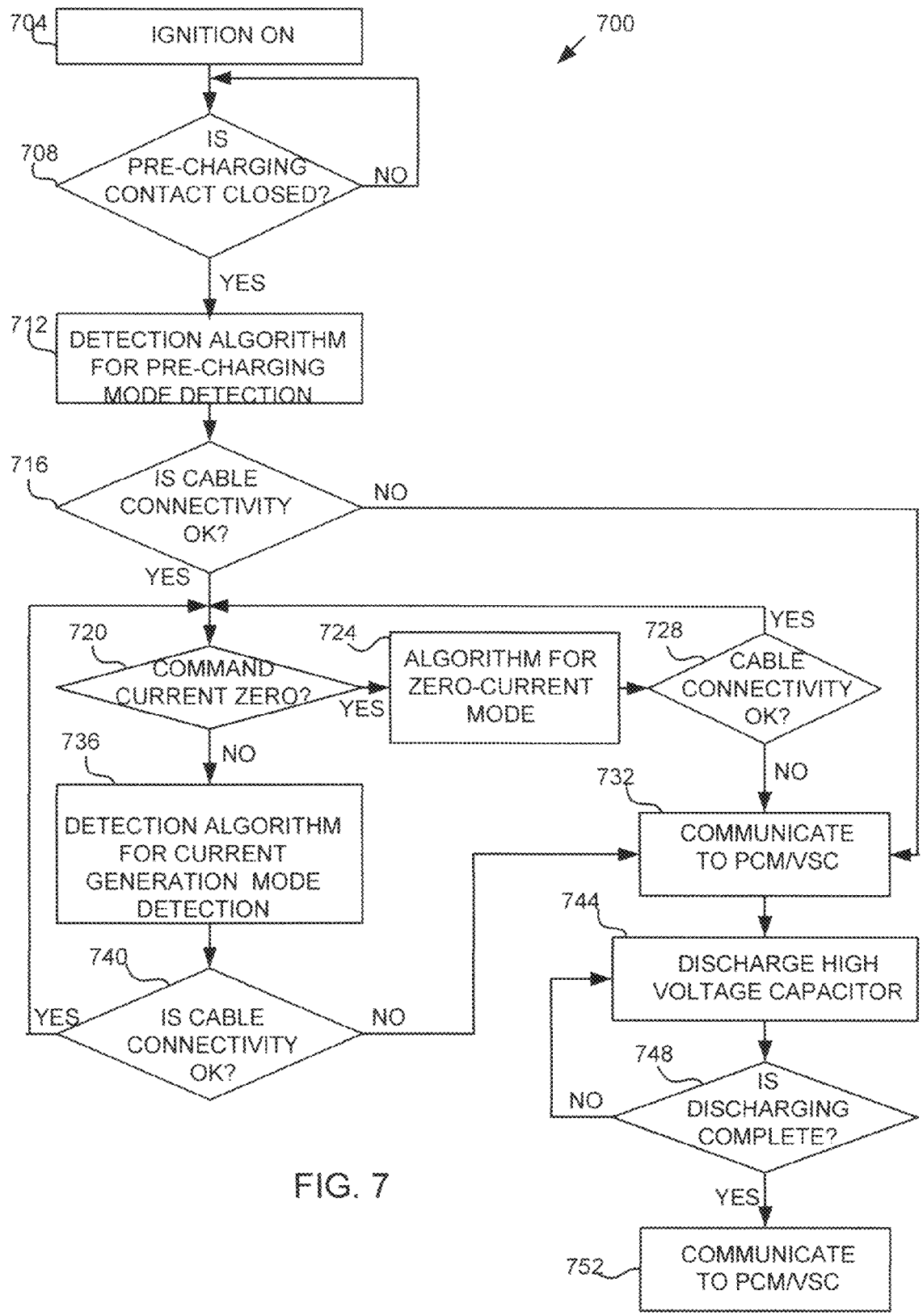
FIG. 7 depicts an example method for detecting a cable connection status.

It is contemplated that various methods using a feedback factor to determine connectivity status can be practiced individually or in combination, and further, that a method used, or algorithm employed, may be dependent on a current operational mode of an EDS or of a vehicle. FIG. 7 shows a flow diagram of an example method 700 that can be practiced in an embodiment in which the invention is used in an electric vehicle. Method 700 includes a plurality of detection algorithms, selection and performance of which is dependent on a current operational mode. At block 704, the method 700 begins when an ignition key of the vehicle is turned to an "ON" position. The PEC controller 126 can obtain "ignition-on" information from a higher level control entity such as the VCS 150. At block 708 a decision is made as to whether a pre-charging contact is closed. Referring to FIGS. 1 and 3, the PEC controller 126 can receive information regarding closure of the contacts 320 that can be provided to the HVIS 128. Contact sensors can provide a signal when the contacts 320 are closed. Accordingly, the PEC controller 126 can receive a contact close signal either from a contacts sensor or from another entity, such as the VCS 150. If the contacts have not been closed, block 708 is repeated. After closure of the pre-charging contacts, a detection algorithm for a pre-charging mode is performed at block 712. An example pre-charging mode algorithm is shown in FIG. 8 and will be discussed later below.

At the conclusion of the pre-charging mode algorithm, a decision regarding cable connectivity, based on the results of the pre-charging mode algorithm, is made at block 716. If the determination is made that the cable connectivity is not good, fault detection action is taken at block 732. As discussed previously, fault-detection action can include notifying a higher-level control unit, such as the PCM 152 or VSC 150, discharging the high voltage capacitor 342, or executing other action. If the determination is made that the cable connectivity is good, then the method continues to block 720, where a determination is made as to whether the EDS is in a current generation mode or not. This determination can be made by checking the command current. In an example embodiment, information regarding the command current can be obtained from the MGCU 542, or alternatively the PEC control device 540. If the command current is zero, the process continues with block 724, at which a detection algorithm for a zero-current operational mode is performed. FIG. 8 shows an example zero-current operational mode algorithm, which will be discussed in greater detail in subsequent paragraphs herein. Based on the outcome of the zero-current detection algorithm, at decision block 728 a determination is made as to whether the cable connectivity is satisfactory. If so, then the process repeats itself by returning to decision block 720. If not, then fault-detection action can be performed at block 732. For example, a fault signal can be communicated to a PCM or VSC. Additional fault-detection action can also be taken. For example, at block 744, the high voltage capacitance 342 can be discharged. At the completion of the discharge process, determined at decision block 748, a signal can be sent to a higher level control unit such as a PCM or VSC, as shown by block 752.

Figure 10:
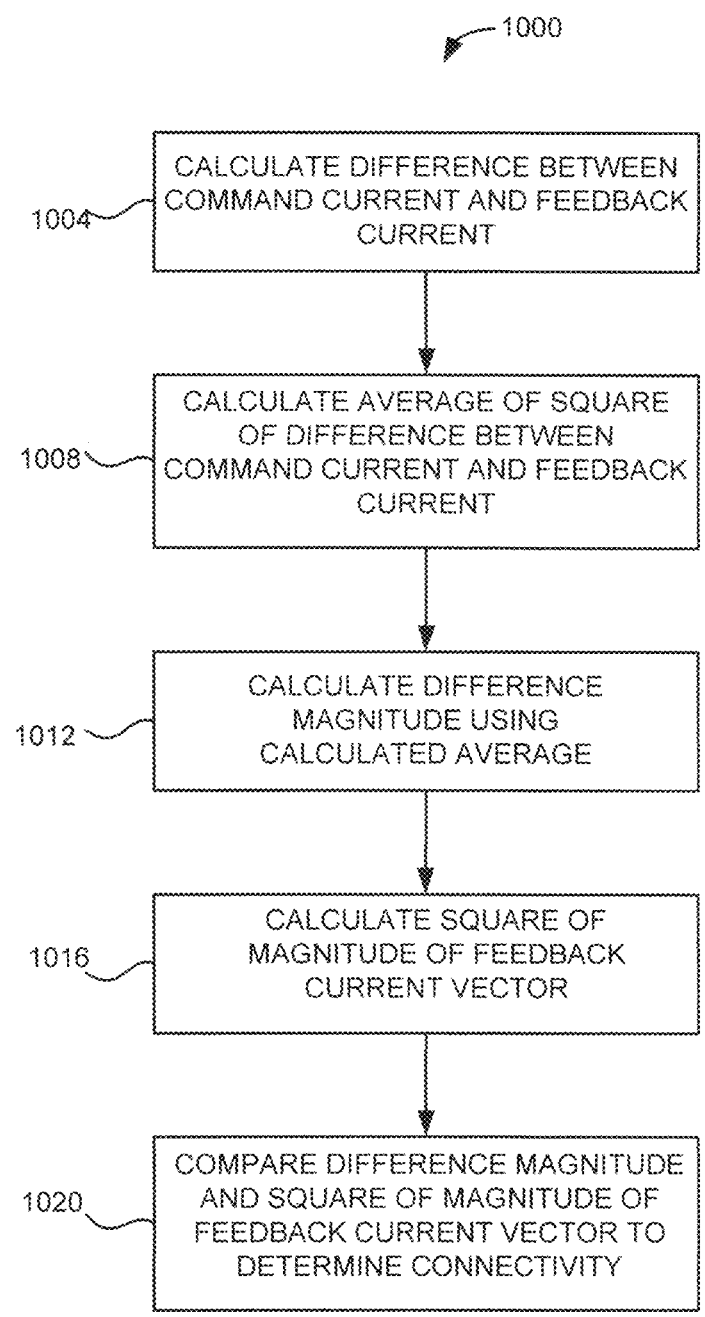
FIG. 10 depicts an example method for determining cable connectivity status.
Figure 11:
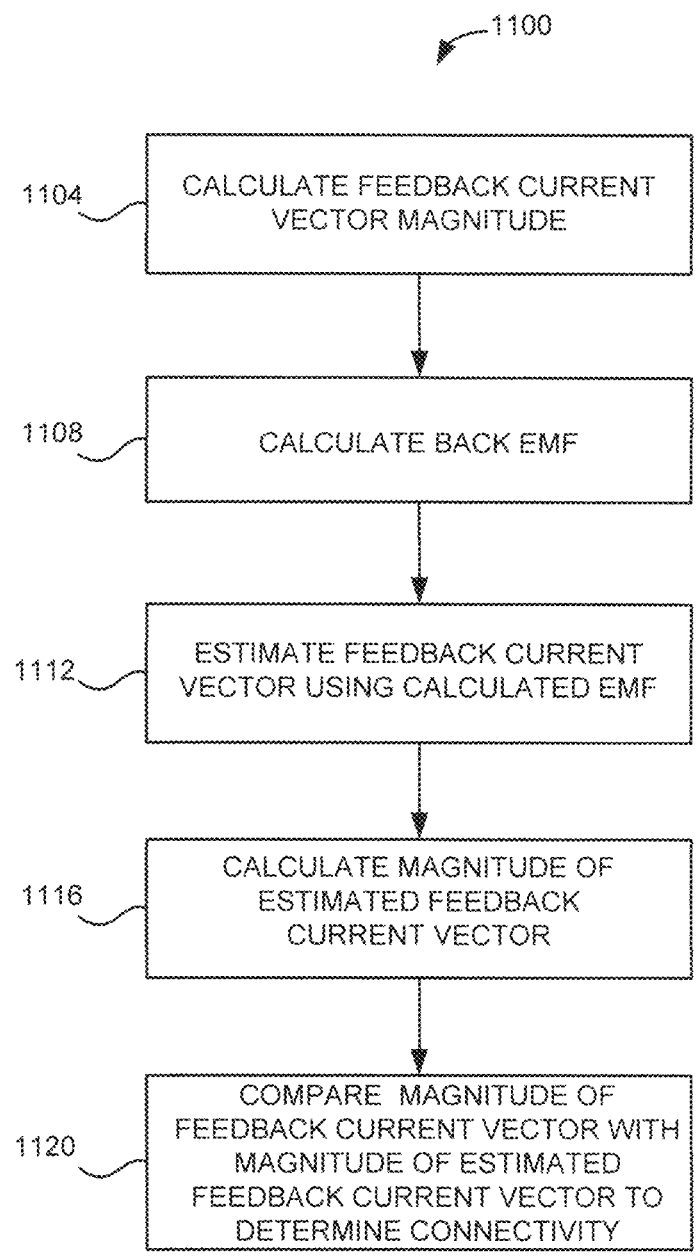
FIG. 11 depicts an example method for determining cable connectivity status.

If the command current is not equal to zero, at block 736 a detection algorithm for a current generation mode is performed. FIGS. 10 and 11, which will be discussed later herein, provide examples of algorithms that can be executed during a current generation mode. Upon completion of the algorithm, at decision block 740, a determination is made regarding cable connectivity status. If the cable is connected, then the process repeats at block 720 for as long as ignition is "ON". If the cable is not connected, then fault-detection action, examples of which were described above, is performed at block 730. In an example embodiment, the method 700 terminates when the ignition is turned to an "OFF" state.

Figure 8:
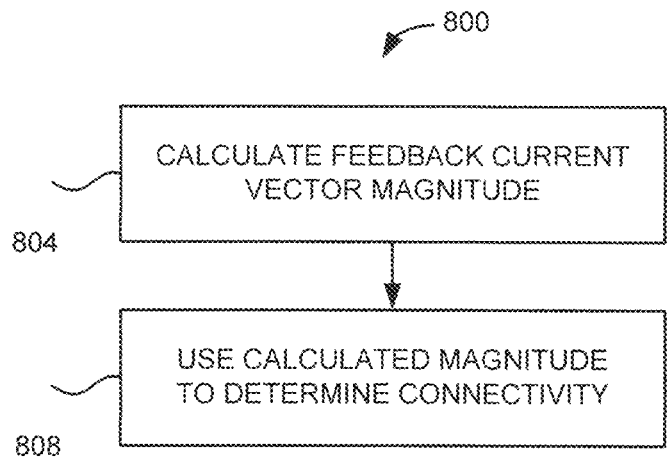
FIG. 8 depicts an example method of determining a cable connection status.

FIG. 8 shows a flow diagram of a method 800 that can be performed to determine cable connectivity during a pre-charging operational mode. Preferably, method 800 is performed prior to the execution of any application code that performs PMSM current and torque control. At block 804, a feedback current magnitude MAG(Is), representing the magnitude of a vector that represents the detected feedback current in a d-q rotor reference plane, is calculated. As shown in FIG. 5, two or more feedback currents Iu, Iv, Iw, can be sampled by sensor 532 and provided to the MGCU 542 or the PEC controller 526. In a preferred embodiment, an analog-digital converter converts analog information to digital information to digitize feedback current information prior to providing input to the HVIS 544. It is preferable that block 804 be executed immediately after the PEC controller 526 receives input from a higher level control unit that a pre-charging contactor has been closed. For example, the PEC controller 526 can receive such input from the VCS 150, for instance from the PCM 152, the TCM 154 or the HVBCM 158. Upon reception of the enabling information that the contactor has been closed, the PEC control device 540 can confirm that any PMSM associated with the EDS is not rotating. For example, the PEC control device 540 or the MGCU 542 can receive input from the position sensor 520 regarding PMSM 534 rotation. For a system such as the one depicted in FIG. 4, input from position sensors (not shown) associated with first PMSM 480 and second PMSM 485 can be used to determine that neither is rotating. The PEC controller 526 can also confirm that a DC-Bus voltage, for an EDS is low, preferably less than 30V. In the example system depicted in FIG. 4, th DC-Bus voltage is the voltage across the capacitors 436, 438 and the resistor 439.

Figure 9:
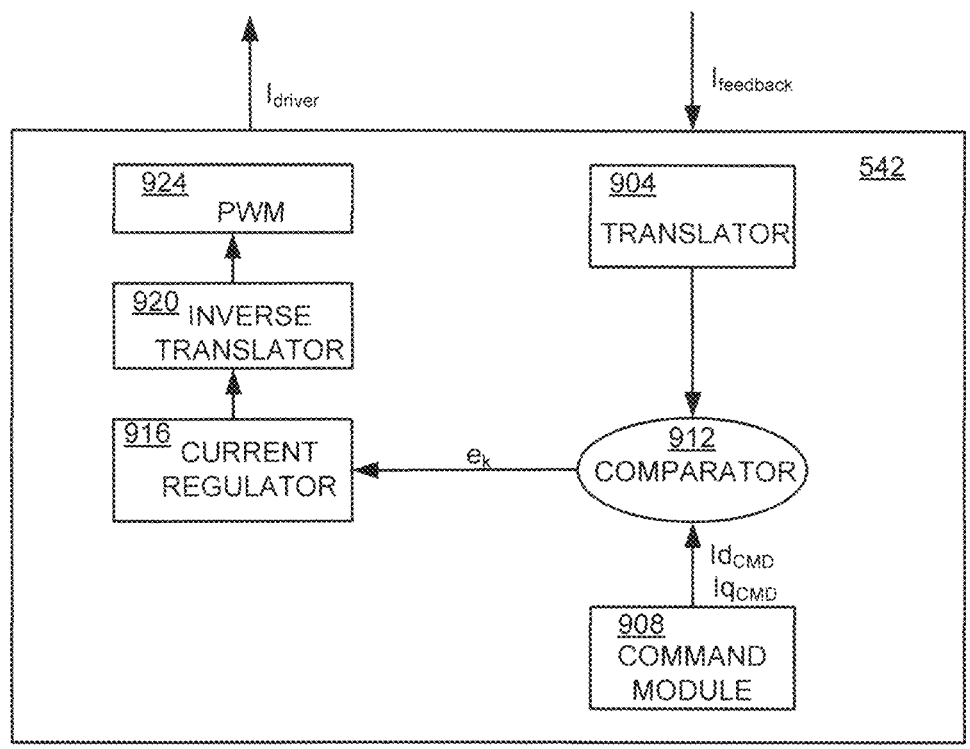
FIG. 9 shows a block diagram of an example system of a motor generator control unit (MGCU).

FIG. 9 depicts a block diagram of an example MGCU 542. In an example embodiment, feedback current input can be received at a translator 904. In an example embodiment, currents Iu, and Iv are sampled by sensor 532. Translator 904 can be configured convert feedback phase currents Iu, and Iv, and possibly Iw to a feedback current vector Is in a d, q, rotating reference frame aligned with a rotor of the PMSM 534. For example, the translator 904 can be configured to perform Park and Clark transformations of sampled feedback currents to provide a vector in d-q space. As known in the art, Park and Clark transformations can be performed using two or three of the three currents provided to the PMSM 534 to provide a feedback current vector in d-q space. The feedback current vector Is has a flux component feedback current $Id_s$, aligned with flux, and a torque component feedback current $Iq_d$, in quadrature with Id. The MGCU 542 can also include a command module 908 which can provide command currents $Iq_{CMD}$ and $Id_{CMD}$. The feedback currents Id and Iq can be compared to reference command currents $Iq_{CMD}$ and $Id_{CMD}$ at comparator 912 to produce an output $e_k$, which represents the error or difference between the command currents and feedback currents. The error $e_k$ can be provided to current regulator 916, which uses the error $e_k$ to generate voltages Vq and Vd, which represent a voltage vector with respect to the rotor of PMSM 534. Voltages Vq and Vd can then be converted back to a reference frame based on the u, v, w stator windings by inverse translator 920 to provide voltages Vu, Vv and Vw. In an exemplary embodiment, inverse translator 920 can be configured to perform inverse Park and Clark transformations to provide the voltages Vu, Vv, and Vw. The voltages Vu, Vv, and Vw can be provided to pulse width modulator (PWM) 924, to produce driver currents Iu, Iv, and Iw, which, in an example embodiment, form gate driver currents for the IGBT transistors of the inverter 430. Although depicted as a portion of the MGCU 542, it is contemplated that the PWM 924 may be arranged as part of the PEC 524. It is further understood that that the Park and Clark transformations and the inverse Park and Clark transformations, as well as the comparison between command and feedback currents may be performed by the PEC controller 540, or alternative module, and are not limited to performance by the MGCU 542.

In an example embodiment, the HVIS 544 calculates the feedback current vector magnitude MAG(Is) using the $Id_s$ and $Iq_s$ that result when the the sampled Iu and Iv undergo Clark and Park transformations by translator 904. In an exemplary embodiment, MAG(Is) is calculated by the equation below:

$$\text{MAG}(Is) = \text{sqrt}[(Id_s)^2 + (Iq_s)^2] \qquad \text{Eqn. 1}$$

At block 808, the incremental value of MAG(Is) is used to determine the connectivity status of cable 530. In a preferred embodiment, if MAG(Is) is larger than 20-30 mA, then a determination is made that the cable 530 is connected; i.e. its connectivity status is good. In a preferred embodiment, method 800 is repeated three times to confirm the connectivity status determination.

After a determination by the HVIS 544 that the cable 530 is connected, a signal can be provided to begin execution of the application code. Should it be determined that the cable 530 is not connected, a fault handling action can be performed.

FIG. 10 depicts an example method 1000 for detecting cable connectivity status when an EDS is in a current-generation mode for producing either motoring torque or generating torque. The current generation can be closed-loop current regulation during low-speed operation, or open-loop voltage controlled (such as six-step PWM) during high-speed operation. In a preferred embodiment, the HVIS 544 can perform a closed-loop version of a current generation mode detection algorithm, and can also perform an open-loop version of a current generation mode detection algorithm. The method 1000 of FIG. 10 can be executed as a closed-loop version of a current generation mode detection algorithm. At block 1004 the HVIS 544 calculates the differences between command currents and feedback currents represented in d-q space. In at least one example, the difference $\Delta$Id between the command current $Id_{CMD}$ and the feedback current $Id_s$ is calculated by:

$$\Delta Id = Id_{CMD} - Id_s \qquad \text{Eqn. 2}$$

Similarly, the difference $\Delta$Iq between command current $Iq_{CMD}$ and feedback current $Iq_s$ is calculated by:

$$\Delta Iq = Iq_{CMD} - Iq_s \qquad \text{Eqn. 3}$$

In one example embodiment, the differences between the command and feedback currents can be obtained from comparator 912. In a further example embodiment, values for command and feedback currents can be provided to HVIS 544 from the MGCU 542 and the HVIS can perform the requisite calculations. For example, command current values can be provided by the command module 908 and feedback current values can be provided by the translator 904, or from sensor 532. At block 1008, the HVIS 544 can calculate the average of the squares of the differences between the command and feedback currents over a predetermined period. In at least one example embodiment, the method 1000 employs the equations below:

$$AVG[(\Delta Id)^2] = \left\{ \sum_{n=1}^{N} [(\Delta Id)^2]_n \right\} \Big/ N \qquad \text{Eqn. 4}$$

$$AVG[(\Delta Iq)^2] = \left\{ \sum_{n=1}^{N} [(\Delta Iq)^2]_n \right\} \Big/ N \qquad \text{Eqn. 5}$$

where N is the number of difference squares calculated;

AVG [(ΔId)²] is the average of the square of the difference between $Id_{CMD}$ and $Id_s$; and AVG [(ΔIq)²] is the average of the square of the difference between $Iq_{CMD}$ and $Iq_s$ In a preferred embodiment, the predetermined period is an electric cycle of an EDS.

At block 1012, a difference magnitude MAG(ΔI) can be calculated using the calculated averages of the squares of the differences between command and feedback currents. For example, a squared difference magnitude [MAG(ΔI)]² can be calculated using the equation below:

$$[MAG(\Delta I)]^2 = AVG[(\Delta Id)^2] + AVG[(\Delta Id)^2] \quad \text{Eqn. 6}$$

At block 1016, the square of the magnitude of the command current is calculated, for example by using the equation below:

$$[MAG(I_{CMD})]^2 = (Id_{CMD})^2 + (Iq_{CMD})^2 \quad \text{Eqn. 7}$$

At block 1020, [MAG(ΔI)]² is compared with [MAG($I_{CMD}$)]² to determine cable connectivity. In at least one example, if [MAG(ΔI)]² is a predetermined percentage of [MAG($I_{CMD}$)]², or within a predetermined range of percentages of [MAG($I_{CMD}$)]², then the determination is made that the cable is connected. In a preferred embodiment, if [MAG(ΔI)]² is calculated to be 15% of [MAG($I_{CMD}$)]², then the cable connectivity status is considered to be good. If [MAG(ΔI)]² fails to be in a predetermined range of percentages of [MAG($I_{CMD}$)]², then the determination can be made that the cable is disconnected. In response to a disconnected status detection, fault-detection actions can be performed. For example, a discharging procedure can be initiated for the high voltage capacitance 342.

FIG. 11 depicts a flow diagram for an example method 1100 that can be performed during an open-loop current-generation mode. At block 1104, a magnitude of a feedback current vector, MAG($I_s$), is calculated. In at least one example, MAG($I_s$) is calculated by the following equation:

$$MAG(I_s) = \text{sqrt}[(Id_s)^2 + (Iq_s)^2] \quad \text{Eqn. 8}$$

As discussed previously herein, $Id_s$ and $Iq_s$ can be provided by the MGCU 542, the PEC controller 540, or can be calculated by the HVIS 544 using feedback current sensed by the sensor 532. At block 1108 back electromotive force for a PMSM (Epm) is calculated. In an example embodiment, Epm is calculated using the following equation:

$$Epm = \omega * \lambda pm \quad \text{Eqn. 9}$$

Where ω is the rotational velocity of a PMSM; and
λpm is the flux generated by rotor permanent magnet.

At block 1112, estimates for the feedback currents can be calculated using the calculated Epm value. In one example, the estimated feedback currents $Id_{EST}$ and $Iq_{EST}$ are calculated using the following equations:

$$Id_{EST} = [RsVd + \omega Lq(Vq - Epm)]/[(Rs)^2 + \omega^2 LdLq] \quad \text{Eqn. 10}$$

$$Iq_{EST} = [-\omega LqVd + Rs(Vq - Epm)]/[(Rs)^2 + \omega^2 LdLq] \quad \text{Eqn. 11}$$

Where: Rs is the stator resistance;
Vd is a voltage along a d-axis of the d-q reference frame;
Vq is a voltage along a q-axis of a d-q reference frame;
Ld is self-inductance of stator along a d-axis of a d-q reference frame; and
Lq is self-inductance of stator along a q-axis of a d-q reference frame At block 1116, an estimated feedback current vector magnitude MAG($Is_{EST}$) can be calculated using the calculated estimates $Id_{EST}$ and $Iq_{EST}$. In an example embodiment, MAG($Is_{EST}$) is calculated using the following equation:

$$MAG(Is_{EST}) = \text{sqrt}[(Id_{EST})^2 + (Iq_{EST})^2] \quad \text{Eqn. 12}$$

At block 1120, MAG(Is) can be compared to MAG($Is_{EST}$) to determine cable connectivity. In at least one example, if MAG (Is) is equal to or larger than a predetermined percentage or predetermined range of percentages of MAG($Is_{EST}$), then the cable connectivity status is deemed to be good or connected. For example, if MAG(Is) is greater than 50% of MAG($Is_{EST}$), cable connectivity status can be determined to be good. In at least one example, if MAG(Is) is less than a predetermined percentage or predetermined range of percentages of MAG ($Is_{EST}$), the cable connectivity status can be determine to be disconnected. In an exemplary embodiment, the process is repeated every 50 ms.

Figure 12:
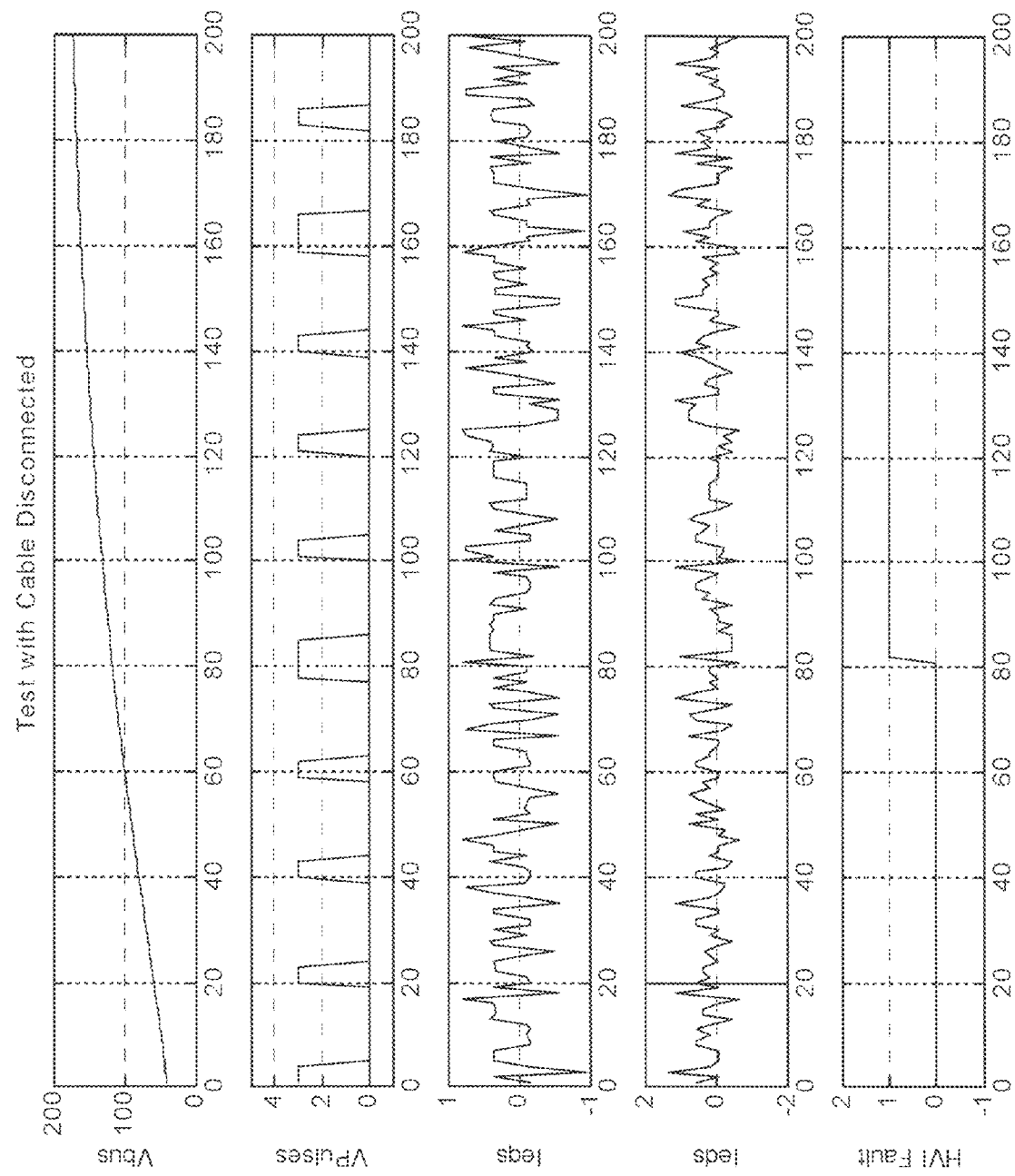
FIG. 12 shows results for a test conducted during a pre-charging mode with a cable disconnected.
Figure 13:
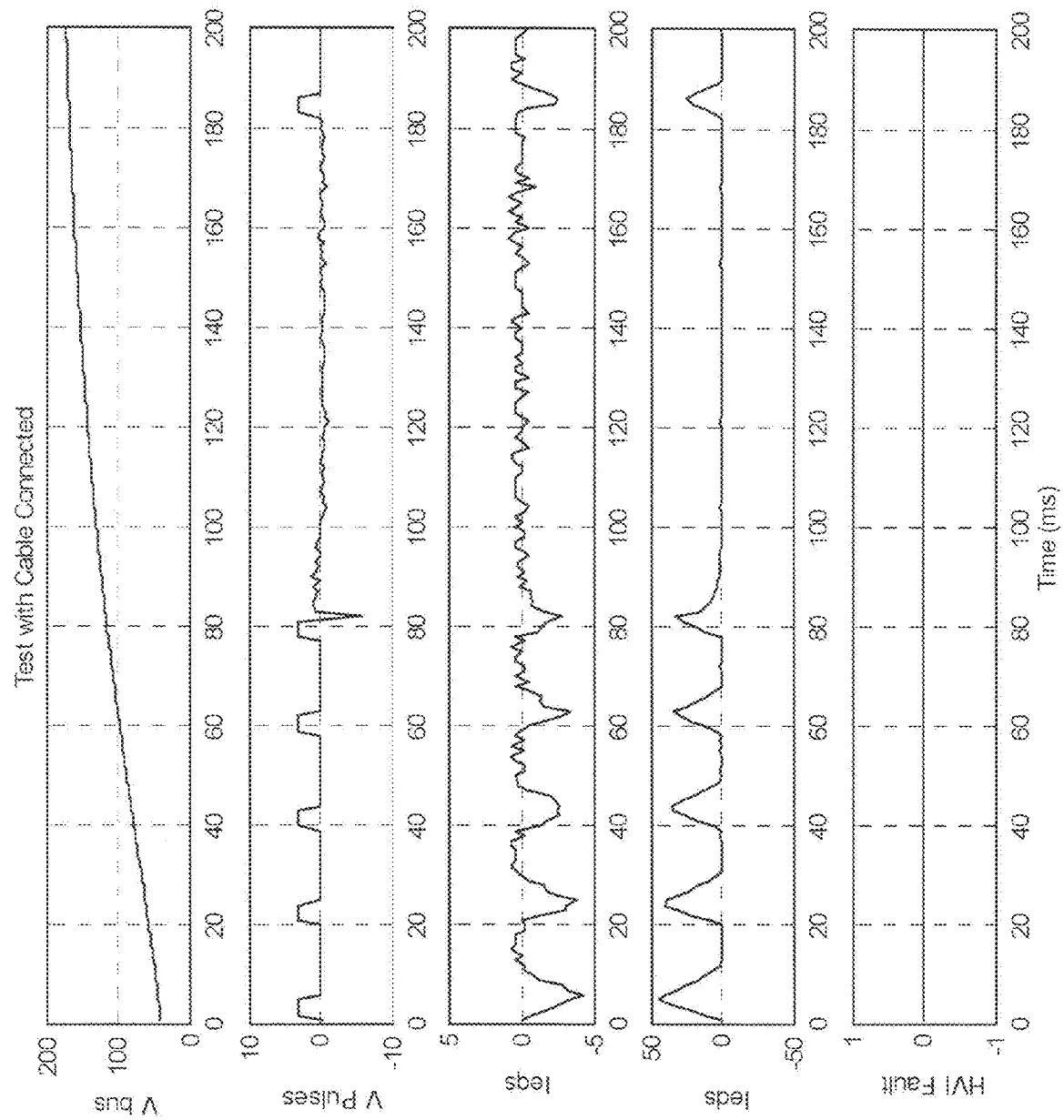
FIG. 13 shows results for a test conducted during a pre-charging mode with a cable connected.
Figure 14:
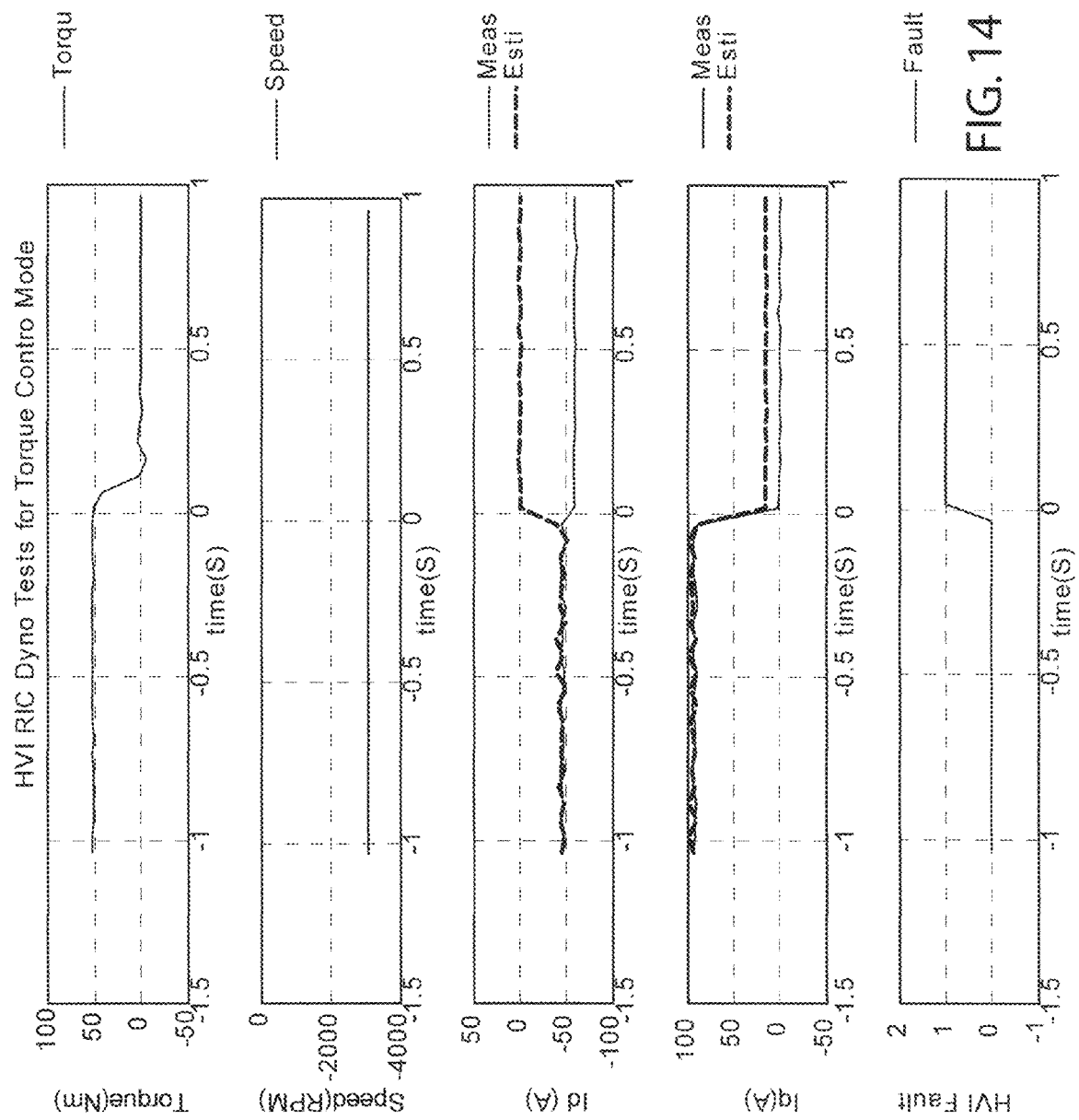
FIG. 14 shows results for a test conducted during a current generation mode with a cable disconnected.
Figure 15:
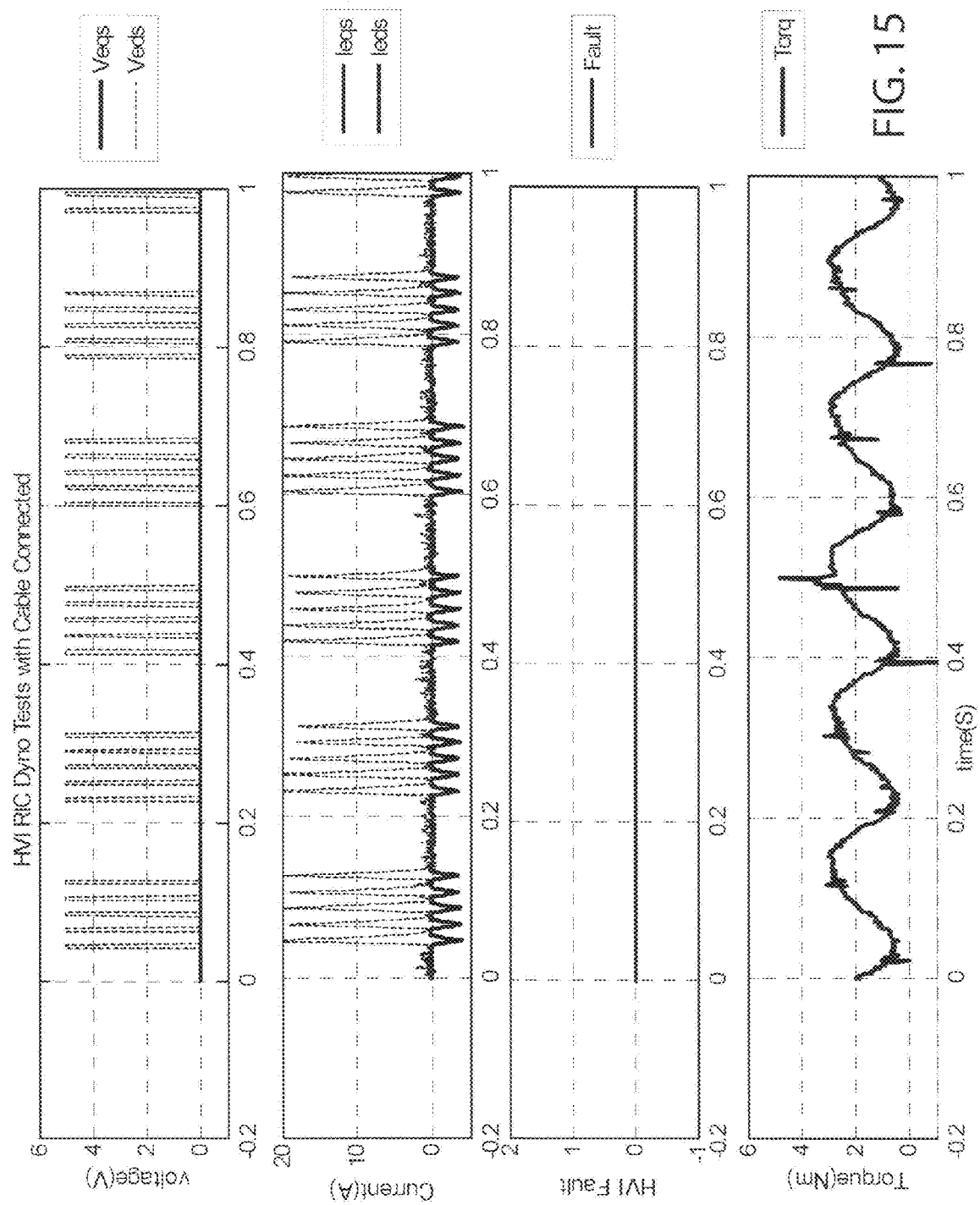
FIG. 15 shows results for a test conducted during a zero-current mode with a cable connected.

Example methods 600, 800, 1000, and 1100 have been implemented successfully to detect cable connectivity. FIG. 12 shows results from a test conducted with a cable disconnected during a pre-charging operational mode. An HVIS correctly generated a fault signal after 80 ms. FIG. 13 shows data obtained during a test conducted during a pre-charging mode with a cable connected. No fault signal was generated by the tested HVIS. FIG. 14 shows data and results from a test conducted during a current-generation mode with a cable disconnected. A fault signal was correctly generated in response to a determination of no cable connectivity. FIG. 15 shows test data and results from a test conducted during a zero-current operational mode with a cable connected. No fault signal was generated by the tested HVIS. Finally, FIGS. 16A-D show test data and results from a test conducted with a cable disconnected during a zero-current operational mode. As shown in FIG. 16C, the tested HVIS produced a fault signal in response to detecting that the cable was disconnected.

Example methods for determining cable connectivity using a feedback factor based on feedback current are presented herein. Preferred embodiments rely on software to implement the methods, eliminating the need for additional or customized hardware. Flowcharts included herein represent control logic which may be implemented using hardware, software, or combination of hardware and software. The control logic may be implemented using any of a number of of known programming or processing techniques or strategies and is not limited to the order or sequence illustrated. Various functions may be performed in the sequence illustrated, at substantially the same time, or in a different sequence while accomplishing the features and advantages of the invention. The illustrated functions may be modified or in some cases omitted without departing from the spirit or scope of the present invention. A VHIS strategy is flexible and applicable to all HEV platforms, without the need to resolve packaging issues or concerns. When implemented as a software-based solution for the need to detect a cable disconnect, a VHIS strategy can be optimized in a calibration phase. The use of well-known, easily available current sensors, position sensors and shaft position resolvers of proven reliability make the VHIS a robust solution for detecting a high voltage cable disconnect.

We claim:

1. A system for determining a voltage cable connection status, comprising:
    a permanent magnet synchronous machine (PMSM);
    a power conversion circuit configured to provide power to said PMSM;
    a controller coupled to said power conversion circuit and configured to control said power conversion circuit;
    a three-phase high voltage cable configured to electrically connect said power conversion circuit to said PMSM;

at least one sensor configured to detect current conducted by said cable;

a high voltage interlock strategy (HVIS) module configured to determine an operational mode in effect at an electric drive system comprising said PMSM and said power conversion circuit, said operational mode being one among a group comprising a pre-charging mode, a zero current mode and a current-generating mode, receive a feedback current vector characterizing said current detected by said at least one sensor, provide at least one feedback factor by performing a set of operations using at least one components of said received feedback current vector, said set of operations dependent on said operational mode, and use said at least one feedback factor to provide a connectivity status for said cable.

2. The system of claim 1, wherein said HVIS module comprises software configured for execution on a general purpose computing device.

3. A method, comprising:

a high voltage interlock strategy (HVIS) module apparatus determining that an electric drive system (EDS) comprising a power conversion circuit and a permanent magnet synchronous machine (PMSM) is in a pre-charge mode by detecting that a pre-charging contact at said power conversion circuit is closed;

in response to detecting said pre-charging contact is closed, said HVIS module receiving a first feedback current vector, said first feedback current vector representing PMSM feedback current detected at a current sensor;

said HVIS module determining a magnitude of said first feedback current vector;

said HVIS module providing a first feedback factor comprising said magnitude;

said HVIS module comparing said first feedback factor to a predetermined threshold;

said HVIS module providing, based on said comparison, a first connectivity status for a high voltage cable configured to electrically couple said power conversion circuit and said PMSM;

wherein said HVIS module is configured to determine an operational mode of said EDS is one among a group comprising a pre-charge mode, a zero-current mode and a current-generating mode.

4. The method of claim 3, further comprising said HVIS module performing a fault-detection action when said cable is determined to be disconnected.

5. The method of claim 3, further comprising:

in response to determining that said cable is connected, said HVIS module determining that said EDS is in if said current generating mode or is in said zero current mode;

said HVIS module selecting a first set of predetermined operations in response to a determination that said EDS is operating in said zero-current mode, or said HVIS selecting a second set of predetermined operations in response to a determination that said EDS is operating in said current-generating mode;

said HVIS module receiving a second feedback current vector;

said HVIS module providing a second feedback factor based on said second feedback current vector, said providing a second feedback factor comprising performing said selected set of predetermined operations using at least one of said components of said second feedback current vector;

said HVIS module using said second feedback factor to determine a second connectivity status for said cable during said zero-current mode or said current-generating mode determined by said HVIS module; and said HVIS module providing a fault detection action in response to a determination that said cable is unconnected.

6. The method of claim 5, wherein in response to a determination that said EDS is operating in said current-generating mode, said receiving a second current vector, said providing a second feedback factor, and said determining a second connectivity status are performed in a closed loop configured to be performed during a current regulation loop of said PMSM operation.

7. The method of claim 5, wherein in response to a determination that said EDS is operating in said current-generating mode, said receiving a second current vector, said providing a second feedback factor, and said determining a second connectivity status are performed in an open loop configured to be performed during a slow loop of said PMSM operation.

8. A method for determining voltage cable connection status, comprising:

a high voltage interlock strategy (HVIS) module determining an operational mode in effect at an electric drive system (EDS) comprising a power conversion circuit and a permanent magnet synchronous machine (PMSM), said HVIS configured to determine that said operational mode is one among a group comprising a pre-charge mode, a zero-current mode or a current-generating mode;

said HVIS module receiving a feedback current vector representing said PMSM feedback current detected by a current sensor;

said HVIS module providing a feedback factor by performing at least one operation using at least one of said feedback current vector components, said at least one operation dependent on which of said pre-charge mode, said zero-current mode or said current-generating mode is determined to be in effect;

said HVIS module providing, based on said feedback factor, a cable connectivity status for a high voltage cable configured to connect said PMSM with said power conversion circuit configured to provide power to said PMSM via said cable; and said HVIS module performing a fault detection action in response to a determination that said cable is disconnected.

9. The method of claim 8, wherein said feedback current is detected during said zero-current operational mode of said PMSM.

10. The method of claim 8, wherein said feedback current is detected during said pre-charging operational mode of said PMSM.

11. The method of claim 8, wherein said HVIS module providing said feedback factor by performing at least one operation using at least one of said feedback current vector components comprises calculating a magnitude of said feedback current vector.

12. The method of claim 11, wherein said HVIS module providing, based on said feedback factor, a cable connectivity status for said cable comprises determining that said cable is connected when said magnitude of said feedback current vector is within a predetermined range of values.

13. The method of claim 12, further comprising in response to a determination that said cable is connected, said HVIS module repeating said method after a predetermined time interval.

14. The method of claim 8, wherein said HVIS module providing said feedback factor is performed after constant command voltages are provided for a predetermined period.

15. The method of claim 8, wherein said feedback current is detected while said PMSM is not rotating.

16. A method for detecting voltage cable connectivity, comprising:
   a high voltage interlock strategy (HVIS) module determining that an electric drive system (EDS) comprising a permanent magnet synchronous machine (PMSM) is in one of a pre-charge mode, a zero-current mode or a current-generating mode;
   said HVIS module receiving a feedback current vector representing permanent magnet synchronous machine (PMSM) feedback current detected by a current sensor;
   receiving at said HVIS module a command current vector characterizing a command current provided for said PMSM;
   said HVIS module calculating a difference between said command current and said feedback current using said feedback current vector and said command current vector;
   said HVIS module calculating an average of a square of said difference between said command current and said feedback current over a predetermined period using said calculated difference;
   said HVIS module calculating a squared difference magnitude using said calculated average;
   said HVIS module calculating a squared command current magnitude using said command current vector;
   said HVIS module comparing said squared difference magnitude and said squared command current magnitude; and
   said HVIS module providing, based on said comparison, a connectivity status of a cable configured to connect said PMSM to a power circuit configured to provide power to said PMSM.

17. The method of claim 16, further comprising said HVIS module performing a fault detection action in response to determining said cable is disconnected from one of said power circuit and said PMSM.

18. The method of claim 16, wherein said feedback current is detected by said current sensor during a current regulation loop of said PMSM control and said calculations performed at said HVIS are performed during said current regulation loop of said PMSM control.

19. The method of claim 16, wherein said calculating a square of a command current magnitude comprises calculating a square of a magnitude of said command current vector.

20. A method for determining a voltage cable connection status, comprising:
   a high voltage interlock strategy (HVIS) module determining that an electric drive system (EDS) comprising a permanent magnet synchronous machine (PMSM) is in one of a pre-charge mode, a zero-current mode or a current-generating mode;
   said HVIS module receiving a feedback current vector representing said PMSM feedback current detected by a current sensor;
   said HVIS module receiving a rotational velocity for said PMSM;
   said HVIS module calculating a feedback current vector magnitude using said feedback current vector;
   said HVIS module calculating back electromotive force for a permanent magnet synchronous motor (PMSM) using said rotational velocity;
   said HVIS module calculating an estimated feedback current vector using said calculated back electromotive force;
   said HVIS module calculating an estimated feedback current vector magnitude using said estimated feedback current vector;
   said HVIS module comparing said feedback current vector magnitude to said estimated feedback current vector magnitude; and
   said HVIS module providing a connectivity status of a cable configured to connect said PMSM with a power circuit configured to provide current to said PMSM based on said comparison.

21. The method of claim 20, further comprising said HVIS module performing a fault-detection action in response to determining said cable is not connected to at least one of said PMSM and said power circuit.

22. The method of claim 20, wherein said method is implemented in a slow loop of electric motor control of said PMSM.

23. A high voltage interlock strategy (HVIS) module, comprising: a non-transitory computer-readable medium having stored thereon sequences of instructions, the sequences of instructions, when executed by a digital processor, cause the processor to determine an operational mode in effect for an electric drive system (EDS) comprising a power conversion circuit and a permanent magnet synchronous machine (PMSM), said operational mode being one of a pre-charge mode, a zero-current mode or a current-generating mode, receive a feedback current vector characterizing feedback current for said PMSM detected by a current sensor, provide a feedback factor by performing a set of operations using at least one of said feedback current vector components, said set of operations determined based on said operational mode, and provide, based on said feedback factor, a connectivity status of a cable configured to connect said PMSM with a power circuit configured to provide current to said PMSM; said sequences of instructions configured to cause said processor to provide said connectivity status during said pre-charge mode said zero-current mode and said current-generating mode of said EDS.

24. The HVIS module of claim 23, further comprising a computing device, and wherein the sequences of instructions are configured as processor-based software executed on said computing device.

* * * * *